(12) United States Patent
Zhao et al.

(10) Patent No.: US 12,154,999 B2
(45) Date of Patent: Nov. 26, 2024

(54) BACK CONTACT SOLAR CELL ASSEMBLY

(71) Applicant: LONGI SOLAR TECHNOLOGY (TAIZHOU) CO., LTD., Jiangsu (CN)

(72) Inventors: Debao Zhao, Jiangsu (CN); Jun Chen, Jiangsu (CN); Hua Li, Jiangsu (CN); Jiyu Liu, Jiangsu (CN)

(73) Assignee: LONGI SOLAR TECHNOLOGY (TAIZHOU) CO., LTD., Jiangsu (CN)

( * ) Notice: Subject to any disclaimer, the term of this patent is extended or adjusted under 35 U.S.C. 154(b) by 0 days.

(21) Appl. No.: 17/920,649

(22) PCT Filed: Nov. 23, 2020

(86) PCT No.: PCT/CN2020/130884
§ 371 (c)(1),
(2) Date: Oct. 21, 2022

(87) PCT Pub. No.: WO2021/232723
PCT Pub. Date: Nov. 25, 2021

(65) Prior Publication Data
US 2023/0155046 A1    May 18, 2023

(30) Foreign Application Priority Data

May 19, 2020  (CN) .......................... 202020844158.8

(51) Int. Cl.
*H01L 31/05*   (2014.01)
(52) U.S. Cl.
CPC ...... *H01L 31/0516* (2013.01); *H01L 31/0508* (2013.01); *H01L 31/0512* (2013.01)
(58) Field of Classification Search
None
See application file for complete search history.

(56) References Cited

U.S. PATENT DOCUMENTS

2002/0059952 A1* 5/2002 Shimada ............... B64G 1/443
                                                     136/244
2006/0060238 A1* 3/2006 Hacke ................. H01L 31/0682
                                                      438/98
(Continued)

FOREIGN PATENT DOCUMENTS

CN           103426960 A       12/2013
CN           105870215 A        8/2016
(Continued)

OTHER PUBLICATIONS

PCT/CN2020/130884 international search report.
AU 2020448642 Examination report No. 1.
EP20936327.4 extended European search report.

*Primary Examiner* — Jayne L Mershon
(74) *Attorney, Agent, or Firm* — IPro, PLLC

(57) ABSTRACT

A back contact solar cell assembly includes at least one cell string including multiple back contact solar cells and multiple electrically conducting lines. Each first electrodes includes first main grid lines and first fine grid lines. Each second electrodes includes second main grid lines and second fine grid lines. Each electrically conducting lines includes a first part conductively connecting the first main grid line of a first back contact solar cell, and a second part conductively connecting the second main grid lines of a neighboring second back contact solar cell. The first part is provided with at least one deformation cushioning component. At the shadow face of the first back contact solar cell, in the direction where the second fine grid lines are provided, the minimum distance between the projection of the deformation cushioning component and the second fine grid lines is greater than or equal to 0.3 mm.

13 Claims, 2 Drawing Sheets

(56) References Cited

U.S. PATENT DOCUMENTS

| | | | | |
|---|---|---|---|---|
| 2009/0038671 A1* | 2/2009 | Yamaguchi | ......... | H01L 31/0504 |
| | | | | 136/244 |
| 2010/0024881 A1* | 2/2010 | Hacke | ................. | H01L 31/0516 |
| | | | | 136/256 |
| 2010/0116323 A1* | 5/2010 | Katayama | ........... | H01L 31/0508 |
| | | | | 438/66 |
| 2014/0373903 A1 | 12/2014 | Hashimoto et al. | | |
| 2015/0380571 A1 | 12/2015 | Shin et al. | | |
| 2017/0040479 A1 | 2/2017 | Tourino et al. | | |
| 2017/0077334 A1 | 3/2017 | Woo et al. | | |
| 2017/0373262 A1 | 12/2017 | Bosman et al. | | |
| 2018/0108794 A1* | 4/2018 | Aiken | ................ | H01L 31/0504 |

FOREIGN PATENT DOCUMENTS

| | | |
|---|---|---|
| CN | 106206758 B | 8/2017 |
| CN | 208256683 U | 12/2018 |
| CN | 109786492 A | 5/2019 |
| CN | 110828598 A | 2/2020 |
| JP | 2005011869 A | 1/2005 |

\* cited by examiner

BACK CONTACT SOLAR CELL ASSEMBLY

The present application claims the priority of the Chinese patent application filed on May 19, 2020 before the Chinese Patent Office with the application number of 202020844158.8 and the title of "BACK CONTACT SOLAR CELL ASSEMBLY", which is incorporated herein in its entirety by reference.

TECHNICAL FIELD

The present disclosure relates to the technical field of photovoltaics, and particularly relates to a back contact solar cell module.

BACKGROUND

In back contact solar cells, all of the negative electrodes and the positive electrodes are arranged at the shadow face of the cells. In the process of forming a cell module by connecting the cells by using electrically conducting lines, because of the single-face welding, the problem of a high sheet breakage rate easily happens.

Currently, a deformation cushioning component is provided in the electrically conducting lines to reduce the thermal stress in single-face welding, thereby reducing the sheet breakage rate.

However, in conventional back contact solar cell assemblies, it is easy to cause a short circuiting at the part provided with the deformation cushioning component.

SUMMARY

The present disclosure provides a back contact solar cell module, which aims at solving the problem that, in conventional back contact solar cell assemblies, it is easy to cause a short circuiting at the part provided with the deformation cushioning component.

According to the first aspect of the present disclosure, there is provided a back contact solar cell module, wherein the back contact solar cell module includes at least one cell string;

the cell string includes a plurality of back contact solar cells and a plurality of electrically conducting lines;
a plurality of first electrodes and a plurality of second electrodes are provided at a shadow face of each of the back contact solar cells;
a polarity of the first electrodes and a polarity of the second electrodes are different;
each of the first electrodes includes first main grid lines and first fine grid lines;
each of the second electrodes includes second main grid lines and second fine grid lines;
each of the electrically conducting lines includes a first part and a second part;
the first part is configured for conductively connecting first main grid lines of a first back contact solar cell, and the second part is configured for conductively connecting second main grid lines of a neighboring second back contact solar cell;
the first back contact solar cell is any one of the plurality of back contact solar cells;
the first part is provided with at least one deformation cushioning component; and
at a shadow face of the first back contact solar cell, in a direction where the second fine grid lines are provided, a minimum distance between a projection of the deformation cushioning component and the second fine grid lines is greater than or equal to 0.3 mm.

Optionally, the first part includes a first deformation starting point and a second deformation starting point, and the deformation cushioning component is located between the first deformation starting point and the second deformation starting point; and
in the direction where the second fine grid lines are provided, distances between second fine grid lines that are located between the first deformation starting point and the second deformation starting point and the projection of the deformation cushioning component are greater than distances between the other second fine grid lines and the projection of the deformation cushioning component by at least 0.3 mm.

Optionally, the first part includes a first deformation starting point and a second deformation starting point, and the deformation cushioning component is located between the first deformation starting point and the second deformation starting point; and
one end close to the deformation cushioning component of second fine grid lines that are located between the first deformation starting point and the second deformation starting point is provided with a bending section, and in the direction where the second fine grid lines are provided, a minimum distance between the bending section and the projection of the deformation cushioning component is greater than or equal to 0.3 mm.

Optionally, the bending section is parallel to a part of the deformation cushioning component that corresponds to the bending section.

Optionally, a bending direction of the deformation cushioning component of the second part is opposite to a bending direction of the deformation cushioning component of the first part.

Optionally, all of the first main grid lines and the second main grid lines are formed by a plurality of bonding pads and grid lines that connect neighboring bonding pads; and
all of regions between each two bonding pads in the first part are provided with at least one instance of the deformation cushioning component.

Optionally, the deformation cushioning component is a circular-arc-shaped bend, and a radius of the circular-arc-shaped bend is less than or equal to 0.2 mm.

Optionally, the circular-arc-shaped bend is parallel to or perpendicular to a shadow face of the back contact solar cell.

Optionally, the deformation cushioning component is a V-shaped bend.

Optionally, the V-shaped bend is parallel to or perpendicular to a shadow face of the back contact solar cell.

Optionally, a size of the electrically conducting line at the deformation cushioning component is the same as a size of the remaining electrically conducting line.

Optionally, each of the electrically conducting lines includes a circular tinned-copper solder strip, and a diameter of the circular tinned-copper solder strip is greater than or equal to 0.25 mm and less than or equal to 0.5 mm.

Optionally, each of the electrically conducting lines is a circular solder strip or a flat solder strip.

In the back contact solar cell module according to the present disclosure, in the electrically conducting lines, the first part conductively connecting the first main grid lines of the first back contact solar cell is provided with at least one deformation cushioning component, at the shadow face of the first back contact solar cell, in the direction where the second fine grid lines are provided, the minimum distance between the projection of the deformation cushioning component and the second fine grid lines is greater than or equal to 0.3 mm, and the polarities of the second fine grid lines and the first main grid lines are different. In other words, at the shadow face of the first back contact solar cell, in the direction where the second fine grid lines are provided, the region within 0.3 mm from the projection of the deformation cushioning component is not provided with the second fine grid line with different polarity. The region within 0.3 mm from the projection of the deformation cushioning component is specially used for preventing short circuiting, which may alleviate to a large extent the problem of short circuiting caused by the provision of the deformation cushioning component.

The above description is merely a summary of the technical solutions of the present disclosure. In order to more clearly know the elements of the present disclosure to enable the implementation according to the contents of the description, and in order to make the above and other purposes, features and advantages of the present disclosure more apparent and understandable, the particular embodiments of the present disclosure are provided below.

BRIEF DESCRIPTION OF THE DRAWINGS

In order to more clearly illustrate the technical solutions of the embodiments of the present disclosure or the prior art, the figures that are required to describe the embodiments or the prior art will be briefly introduced below. Apparently, the figures that are described below are embodiments of the present disclosure, and a person skilled in the art can obtain other figures according to these figures without paying creative work.

In order to more clearly illustrate the technical solutions of the embodiments of the present disclosure, the figures that are required to describe the embodiments of the present disclosure will be briefly introduced below. Apparently, the figures that are described below are embodiments of the present disclosure, and a person skilled in the art can obtain other figures according to these figures without paying creative work.

DESCRIPTION OF THE REFERENCE NUMBERS

11—back contact solar cells, 12—electrically conducting lines, 13—bonding pads, 111—first main grid lines, 112—first fine grid lines, 113—second main grid lines, 114—second fine grid lines, 121—deformation cushioning component, and 1141—bending section.

DETAILED DESCRIPTION

In order to make the objects, the technical solutions and the advantages of the embodiments of the present disclosure clearer, the technical solutions of the embodiments of the present disclosure will be clearly and completely described below with reference to the drawings of the embodiments of the present disclosure. Apparently, the described embodiments are merely certain embodiments of the present disclosure, rather than all of the embodiments. All of the other embodiments that a person skilled in the art obtains on the basis of the embodiments of the present disclosure without paying creative work fall within the protection scope of the present disclosure.

The technical solutions of the embodiments of the present disclosure will be clearly and completely described below with reference to the drawings of the embodiments of the present disclosure. Apparently, the described embodiments are merely certain embodiments of the present disclosure, rather than all of the embodiments. All of the other embodiments that a person skilled in the art obtains on the basis of the embodiments of the present disclosure without paying creative work fall within the protection scope of the present disclosure.

The inventor of the present disclosure has found out by studying that the reason why, in back contact solar-cell assemblies, the part provided with the deformation cushioning component is likely to cause a short circuiting is that the deformation cushioning component, after absorbing thermal stress, has a certain amount of deformation or displacement, whereby the deformation cushioning component easily contacts the fine grid lines of the different polarity to it that are provided around the deformation cushioning component, to result in short circuiting.

Figure 1:
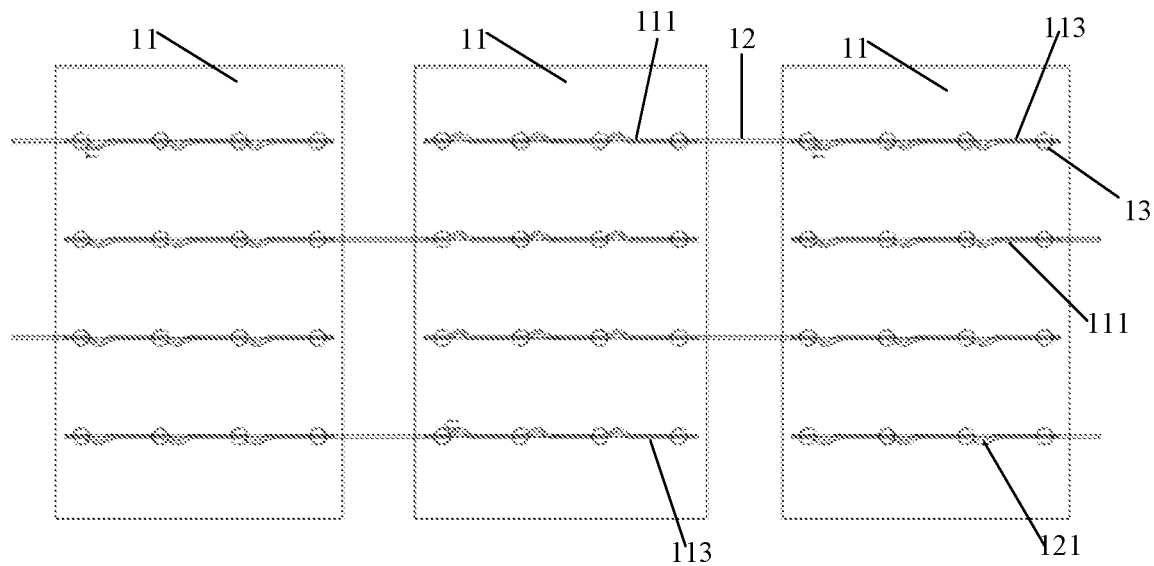
FIG. 1 shows a schematic structural diagram of a cell string according to an embodiment of the present disclosure.

The back contact solar cell module includes at least one cell string. Referring to FIG. 1, FIG. 1 shows a schematic structural diagram of a cell string according to an embodiment of the present disclosure. FIG. 1 is a bottom view viewed from the shadow faces of the back contact solar cells in the cell string to the light facing faces. The cell string includes a plurality of back contact solar cells 11 and a plurality of electrically conducting lines 12. The quantities of the plurality of back contact solar cells 11 and the plurality of electrically conducting lines 12 included in the cell string are not particularly limited.

Referring to FIG. 1, a plurality of first electrodes and a plurality of second electrodes are provided at the shadow face of each of the back contact solar cells 11. The polarity of the first electrodes and the polarity of the second electrodes are different. For example, the first electrodes may be the negative electrodes, and the second electrodes are the positive electrodes. Alternatively, the first electrodes may be the positive electrodes, and the second electrodes are the negative electrodes. The silicon substrate of each of the back contact solar cells 11 may include a plurality of first diffusion regions and a plurality of second diffusion regions, and the doping types of the first diffusion region and the second diffusion region are different. The first electrodes may be connected to the first diffusion regions, and the second electrodes may be connected to the second diffusion regions.

Figure 2:
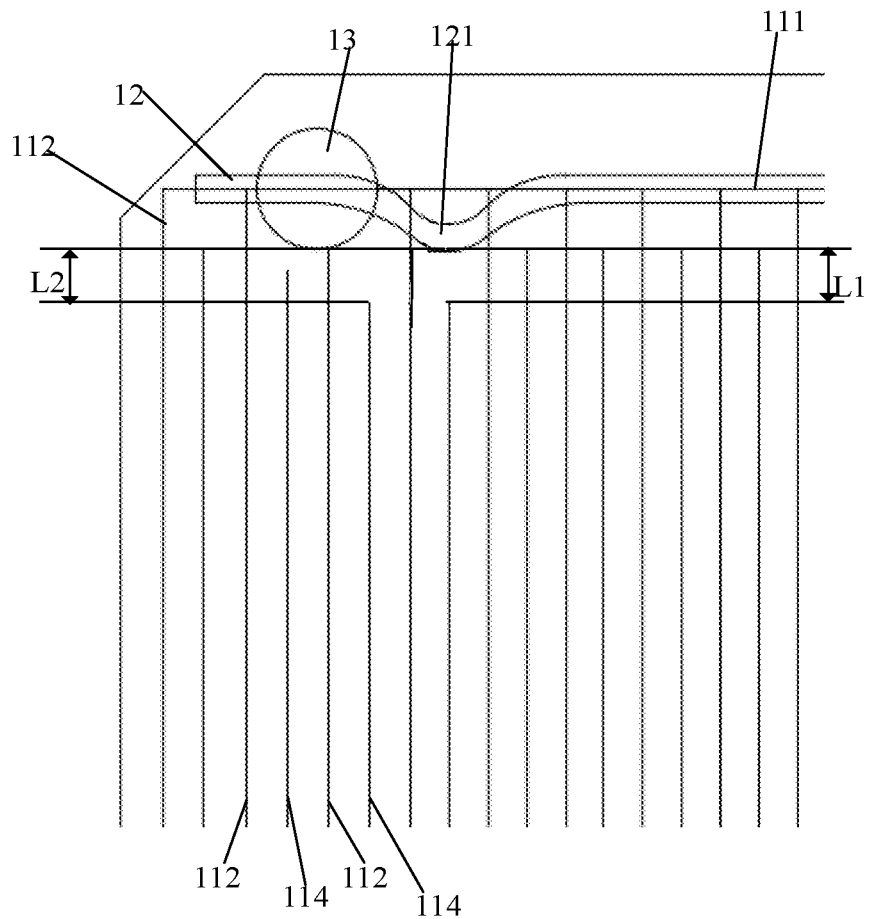
FIG. 2 shows a partially enlarged schematic diagram of a cell string according to an embodiment of the present disclosure.

Referring to FIG. 2, FIG. 2 shows a partially enlarged schematic diagram of a cell string according to an embodiment of the present disclosure. Referring to FIGS. 1 and 2, each of the first electrodes may include first main grid lines 111 and first fine grid lines 112, and the quantity of the first fine grid lines is not particularly limited. The first fine grid lines 112 may be electrically connected to and contact the first diffusion regions of the silicon substrate of the back contact solar cell 11. Each of the second electrodes may include second main grid lines 113 and second fine grid lines 114, and the quantity of the second fine grid lines is not particularly limited. The second fine grid lines 114 may be electrically connected to and contact the second diffusion regions of the silicon substrate of the back contact solar cell 11. The doping types of the first diffusion regions and the second diffusion regions are different. It should be noted that the first fine grid lines and the second fine grid lines are not shown in FIG. 1.

Referring to FIG. 1, in each of the back contact solar cells 11, the first main grid lines 111 and the second main grid lines 113 are arranged in parallel and alternately. In other words, in each of the back contact solar cells 11, the first main grid lines 111 and the second main grid lines 113 are parallel, one second main grid line 113 is disposed between two first main grid lines 111, and one first main grid line 111 is disposed between two second main grid lines 113.

Referring to FIGS. 1 and 2, each of the electrically conducting lines 12 includes a first part and a second part. The first part is used for conductively connecting the first main grid lines 111 of a first back contact solar cell 11, and the second part is used for conductively connecting the second main grid lines 113 of a neighboring second back contact solar cell. As shown in FIG. 1, the part of the electrically conducting line marked with 12 in FIG. 1 that is conductively connected to the first main grid lines 111 of the second back contact solar cell 11 from left to right is the above-described first part, and the part that is conductively connected to the second main grid lines 113 of the third back contact solar cell 11 from left to right is the above-described second part.

The first back contact solar cell is any one of the plurality of back contact solar cells. Referring to FIG. 2, the first part is provided with at least one deformation cushioning component 121. At a shadow face of the first back contact solar cell, in the direction where the second fine grid lines 114 are provided, the minimum distance L1 between the projection of the deformation cushioning component 121 and the second fine grid lines 114 is greater than or equal to 0.3 mm. The polarities of the second fine grid lines 114 and the first main grid lines 111 are different. In the electrically conducting lines, the first part conductively connecting the first main grid lines of the first back contact solar cell is provided with at least one deformation cushioning component, and at the shadow face of the first back contact solar cell, in the direction where the second fine grid lines 114 are provided, the minimum distance between the projection of the deformation cushioning component and the second fine grid lines is greater than or equal to 0.3 mm, and the polarities of the second fine grid lines and the first main grid lines are different. In other words, at the shadow face of the first back contact solar cell, in the direction where the second fine grid lines 114 are provided, the region within 0.3 mm from the projection of the deformation cushioning component is not provided with the second fine grid line with different polarity. The region within 0.3 mm from the projection of the deformation cushioning component is specially used for preventing short circuiting, which may alleviate to a large extent the problem of short circuiting caused by the provision of the deformation cushioning component.

It should be noted that, referring to FIGS. 1 and 2, the second part of the electrically conducting line is also provided with at least one deformation cushioning component 121. Regarding the second part of the electrically conducting line, and at the shadow face of the first back contact solar cell, in the direction where the first fine grid lines 112 are provided, the minimum distance between the projection of the deformation cushioning component 121 and the first fine grid lines 112 is greater than or equal to 0.3 mm. The polarities of the first fine grid lines 112 and the second main grid lines 113 are different. That also alleviates to a large extent the problem of short circuiting caused by the provision of the deformation cushioning component.

Optionally, referring to FIG. 1 or 2, the first part may include a first deformation starting point and a second deformation starting point. The deformation cushioning component 121 is located between the first deformation starting point and the second deformation starting point. Referring to FIG. 2, in the direction where the second fine grid lines 114 are provided, the distances L2 between the second fine grid lines 114 that are located between the first deformation starting point and the second deformation starting point and the projection of the deformation cushioning component 121 are greater than the distances between the other second fine grid lines 114 and the projection of the deformation cushioning component 121 by at least 0.3 mm. In other words, as compared with the second fine grid lines that do not intersect with the projection of the deformation cushioning component, in the direction where the second fine grid lines 114 are provided, the distances between the second fine grid lines that might intersect with the projection of the deformation cushioning component and the projection of the deformation cushioning component 121 are set to be at least 0.3 mm, which may alleviate to a large extent the problem of short circuiting caused by the provision of the deformation cushioning component.

Figure 3:
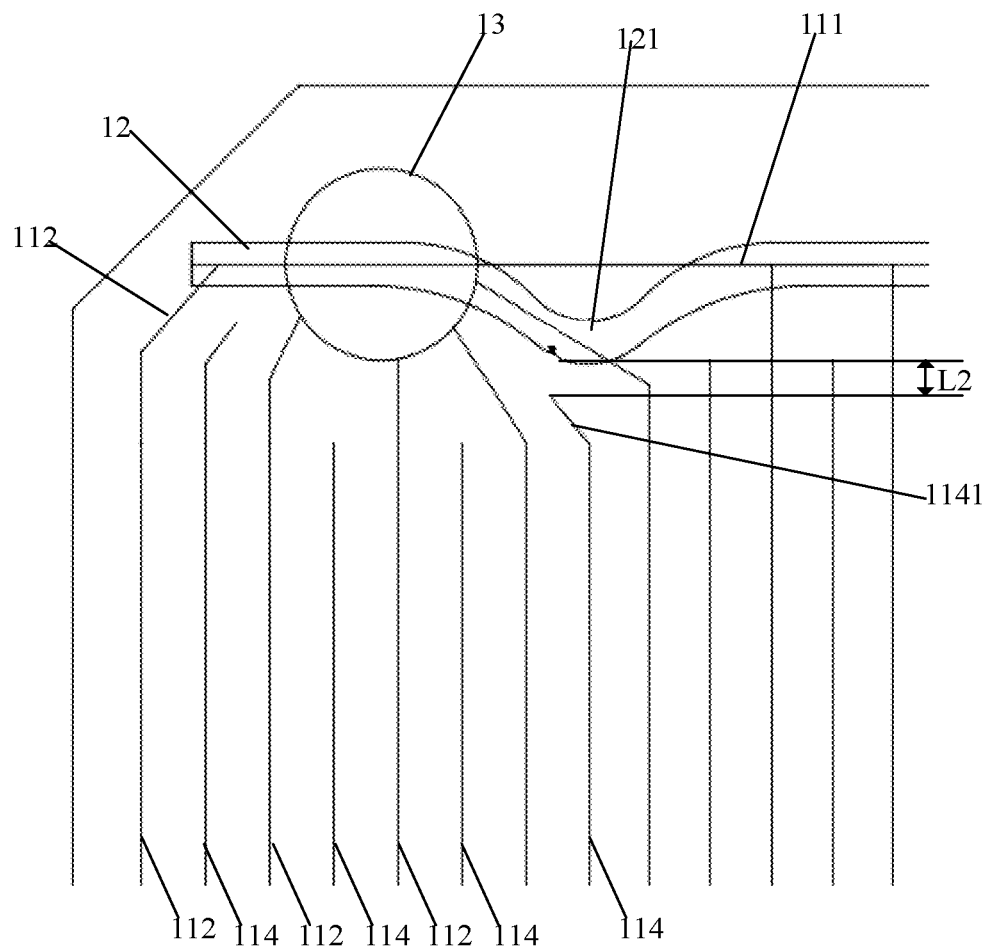
FIG. 3 shows a partially enlarged schematic diagram of another cell string according to an embodiment of the present disclosure.

Referring to FIG. 3, FIG. 3 shows a partially enlarged schematic diagram of another cell string according to an embodiment of the present disclosure. Referring to FIGS. 1 and 3, the first part may include a first deformation starting point and a second deformation starting point. The deformation cushioning component 121 is located between the first deformation starting point and the second deformation starting point. One end close to the deformation cushioning component 121 of the second fine grid lines 114 that are located between the first deformation starting point and the second deformation starting point is provided with a bending section 1141, and in the direction where the second fine grid lines 114 are provided, the minimum distance L2 between the bending section 1141 and the projection of the deformation cushioning component 121 is greater than or equal to 0.3 mm. In other words, for the second fine grid lines that might intersect with the projection of the deformation cushioning component, part of the second fine grid lines at the end of the second fine grid lines that are close to the deformation cushioning component 121 are deviated, so that the second fine grid line is not provided in the region around the projection of the deformation cushioning component either, which may alleviate to a large extent the problem of short circuiting caused by the provision of the deformation cushioning component. Moreover, as compared with the other second fine grid lines, the lengths of the second fine grid lines 114 located between the first deformation starting point and the second deformation starting point are not reduced, which may maximize the current collection, and facilitate to reduce the ineffective space where very little electric current may be extracted or on electric current may be extracted, to increase the cell efficiency.

Optionally, referring to FIG. 3, the bending section 1141 is parallel to the part of the deformation cushioning component 121 that corresponds to the bending section 1141. Accordingly, the distance between the bending section 1141 and the deformation cushioning component 121 can maintain constant, which may prevent short circuiting. Furthermore, that may further maximize the current collection, and facilitate to reduce the ineffective space where very little electric current may be extracted or on electric current may be extracted, to increase the cell efficiency.

Optionally, the bending direction of the deformation cushioning component of the second part is opposite to the bending direction of the deformation cushioning component of the first part. Accordingly, in the cell string or the cell module, the strain releases generated in two neighboring back contact solar cells are offset and compensated, to reduce the stress concentration and the warping and deformation of the back contact solar cells caused thereby.

Figure 4:
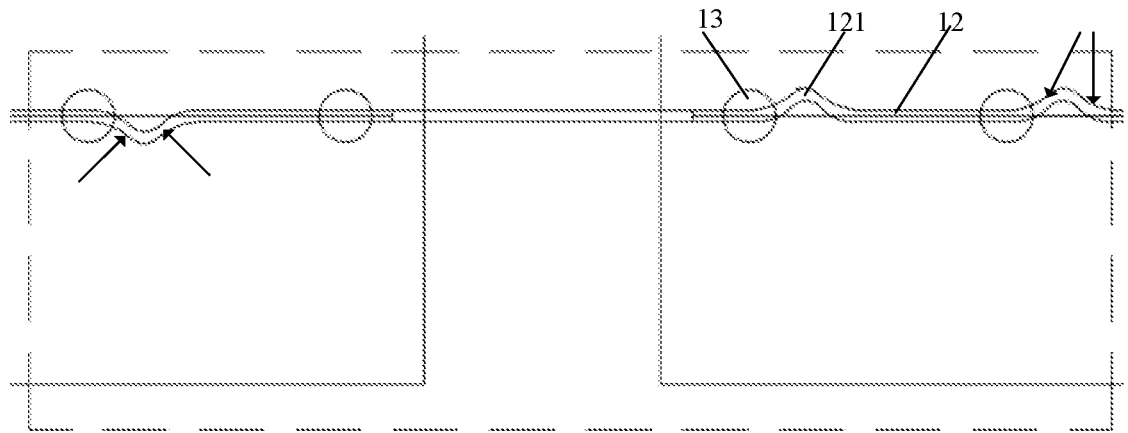
FIG. 4 shows a schematic diagram of strain release according to an embodiment of the present disclosure.

Particularly, referring to FIG. 4, FIG. 4 shows a schematic diagram of strain release according to an embodiment of the present disclosure. As shown in FIG. 4, the part of the electrically conducting line that corresponds to the back contact solar cell on the left may be the first part of the electrically conducting line 12, and the part of the electrically conducting line that corresponds to the back contact solar cell on the right may be the second part of the electrically conducting line 12. The directions indicated by the arrows are the strain-release directions. The strain-release directions of the deformation cushioning component 121 of the first part have upward components, and the strain-release directions of the deformation cushioning component 121 of the second part have downward components. In the cell string or the cell module, the electrically conducting line 12 interconnects the negative electrode and the positive electrode of the two neighboring back contact solar cells, and the stress generated by the welding of one of the back contact solar cells is definitely transmitted to the neighboring back contact solar cell. The design of the opposite bends shown in FIG. 4 enables the strain releases generated in the two neighboring back contact solar cells to be offset and compensated, to reduce the stress concentration of the interconnecting electrically conducting line and the warping and deformation of the back contact solar cells caused thereby.

It should be noted that the bending directions of the deformation cushioning components 121 in the first part or the second part may be the same or different, which is not particularly limited. For example, in the first part, the bending directions of the deformation cushioning components 121 are the same, which facilitates the processing of the deformation cushioning components 121. As another example, in the first part, the bending directions of the neighboring deformation cushioning components 121 are opposite, which may also achieve the effects of offsetting and compensating strains and reducing warping and deformation.

Optionally, referring to FIGS. 1 to 4, all of the first main grid lines 111 and the second main grid lines 113 are formed by a plurality of bonding pads 13 and grid lines that connect neighboring bonding pads. All of the regions between each two bonding pads 13 in the first part of the electrically conducting line 12 are provided with at least one deformation cushioning component 121, which may further reduce warping and sheet breakage.

Optionally, the shape of the bonding pads may be any shape that can be easily processed, such as a circle, an ellipse or a rectangle. The quantity of the bonding pads of each of the first main grid lines or the second main grid lines is 4-16. The diameter of the circular bonding pads is ≤2 mm.

For example, if a half of the back contact solar cell is used, the quantity of the bonding pads of each of the first main grid lines or the second main grid lines is 5. A circular solder strip with a diameter being 0.4 mm is pulled by using the pulling claws of an automatic series welding machine, bent locally by using a bending device to form a plurality of circular-arc-shaped deformation cushioning components with a maximum radius being r=0.2 mm, subsequently arranged to a plurality of negative electrode bonding pads of a plurality of negative electrodes in one back contact solar cell of the plurality of back contact solar cells and a plurality of positive electrode bonding pads of a plurality of positive electrodes in the neighboring back contact solar cell of that back contact solar cell, and joined to the circular bonding pads of the negative electrodes and the negative electrodes by welding to form the cell string.

Optionally, the deformation cushioning component is a circular-arc-shaped bend, and the radius of the circular-arc-shaped bend is less than or equal to 0.2 mm, which does not only have a good effect of reducing warping and sheet breakage, but also results in an esthetically better shape of the cell string or the cell module.

Optionally, the circular-arc-shaped bend is parallel to or perpendicular to the shadow face of the back contact solar cell, which does not only have a good effect of reducing warping and sheet breakage, but also results in an esthetically better shape of the cell string or the cell module.

Optionally, the deformation cushioning component is a V-shaped bend, which does not only have a good effect of reducing warping and sheet breakage, but also results in an esthetically better shape of the cell string or the cell module.

Optionally, the V-shaped bend is parallel to or perpendicular to the shadow face of the back contact solar cell, which does not only have a good effect of reducing warping and sheet breakage, but also results in an esthetically better shape of the cell string or the cell module.

Optionally, referring to FIGS. 1 to 4, the size of the electrically conducting line at the deformation cushioning component is equal to the size of the remaining electrically conducting line. In other words, the deformation cushioning component does not change the dimension of the electrically conducting line, and thus does not reduce the capacity of current collection of the electrically conducting line at the position of the deformation cushioning component.

Optionally, each of the electrically conducting lines includes a circular tinned-copper solder strip, and the diameter of the circular tinned-copper solder strip is greater than or equal to 0.25 mm and less than or equal to 0.5 mm. With the same quantity of the deformation cushioning component, that may more effectively reduce the welding thermal stress. It should be noted that a thinner circular tinned-copper solder strip increases the resistance loss, and a thicker circular tinned-copper solder strip has a lower resistance loss. For example, the diameter of the circular tinned-copper solder strip may be 0.3-0.5 mm.

Optionally, each of the electrically conducting lines includes a circular solder strip or a flat solder strip. The electrically conducting lines are welded to the first main grid lines of the first back contact solar cell, and welded to the second main grid lines of the neighboring second back contact solar cell. When all of the first main grid lines and the second main grid lines are formed by a plurality of bonding pads and grid lines that connect neighboring bonding pads, the electrically conducting lines are welded to the bonding pads of the first main grid lines of the first back contact solar cell, and welded to the bonding pads of the second main grid lines of the neighboring second back contact solar cell.

It should be noted that the relative position of the deformation cushioning component of the second part of the electrically conducting line and the first fine grid lines is the same as the relative position of the deformation cushioning component of the first part of the electrically conducting line and the second fine grid lines, which, in order to avoid replication, is not discussed herein further.

It should be noted that, regarding the process embodiments, for brevity of the description, all of them are expressed as the combination of a series of actions, but a person skilled in the art should know that the embodiments of the present application are not limited by the sequences of the actions that are described, because, according to the embodiments of the present application, some of the steps may have other sequences or be performed simultaneously. Secondly, a person skilled in the art should also know that all of the embodiments described in the description are preferable embodiments, and not all of the actions that they involve are required by the embodiments of the present application.

It should be noted that the terms "include", "comprise" or any variants thereof, as used herein, are intended to cover non-exclusive inclusions, so that processes, methods, articles or devices that include a series of elements do not only include those elements, but also include other elements that are not explicitly listed, or include the elements that are inherent to such processes, methods, articles or devices. Unless further limitation is set forth, an element defined by the wording "comprising a . . . " does not exclude additional same element in the process, method, article or device comprising the element.

The embodiments of the present disclosure are described above with reference to the drawings. However, the present disclosure is not limited to the above particular embodiments. The above particular embodiments are merely illustrative, rather than limitative. A person skilled in the art, under the motivation of the present disclosure, can make many variations without departing from the spirit of the present disclosure and the protection scope of the claims, and all of the variations fall within the protection scope of the present disclosure.

The above-described device embodiments are merely illustrative, wherein the units that are described as separate components may or may not be physically separate, and the components that are displayed as units may or may not be physical units; in other words, they may be located at the same one location, and may also be distributed to a plurality of network units. Some or all of the modules may be selected according to the actual demands to realize the purposes of the solutions of the embodiments. A person skilled in the art can understand and implement the technical solutions without paying creative work.

The "one embodiment", "an embodiment" or "one or more embodiments" as used herein means that particular features, structures or characteristics described with reference to an embodiment are included in at least one embodiment of the present disclosure. Moreover, it should be noted that here an example using the wording "in an embodiment" does not necessarily refer to the same one embodiment.

The description provided herein describes many concrete details. However, it can be understood that the embodiments of the present disclosure may be implemented without those concrete details. In some of the embodiments, well-known processes, structures and techniques are not described in detail, so as not to affect the understanding of the description.

In the claims, any reference signs between parentheses should not be construed as limiting the claims. The word "include" does not exclude elements or steps that are not listed in the claims. The word "a" or "an" preceding an element does not exclude the existing of a plurality of such elements. The present disclosure may be implemented by means of hardware comprising several different elements and by means of a properly programmed computer. In unit claims that list several devices, some of those devices may be embodied by the same item of hardware. The words first, second, third and so on do not denote any order. Those words may be interpreted as names.

Finally, it should be noted that the above embodiments are merely intended to explain the technical solutions of the present disclosure, and not to limit them. Although the present disclosure is explained in detail with reference to the above embodiments, a person skilled in the art should understand that he can still modify the technical solutions set forth by the above embodiments, or make equivalent substitutions to part of the technical features of them. However, those modifications or substitutions do not make the essence of the corresponding technical solutions depart from the spirit and scope of the technical solutions of the embodiments of the present disclosure.

The invention claimed is:

1. A back contact solar cell module, wherein the back contact solar cell module comprises at least one cell string;
   the cell string comprises a plurality of back contact solar cells and a plurality of electrically conducting lines;
   a plurality of first electrodes and a plurality of second electrodes are provided at a shadow face of each of the back contact solar cells;
   a polarity of the first electrodes and a polarity of the second electrodes are different;
   each of the first electrodes comprises first main grid lines and first fine grid lines;
   each of the second electrodes comprises second main grid lines and second fine grid lines;
   all of the first main grid lines and the second main grid lines are formed by a plurality of bonding pads and grid lines that connect neighboring bonding pads;
   each of the electrically conducting lines is welded to the bonding pads of one of the first main grid lines of a first back contact solar cell, and welded to the bonding pads of a corresponding one of the second main grid lines of a neighboring second back contact solar cell;
   the electrically conducting line comprises a first part welded to the bonding pads of the first main grid line of the first back contact solar cell, and a second part welded to the bonding pads of the second main grid line of the neighboring second back contact solar cell;
   the first part is configured for conductively connecting the first main grid line of the first back contact solar cell, and the second part is configured for conductively connecting the second main grid line of the neighboring second back contact solar cell;
   the first back contact solar cell is any one of the plurality of back contact solar cells;
   the first part is provided with a plurality of deformation cushioning components at the shadow face of the first back contact solar cell; and
   at the shadow face of the first back contact solar cell, in a direction where the second fine grid lines are provided, a minimum distance between projections of the deformation cushioning components and the second fine grid lines is greater than or equal to 0.3 mm.

2. The back contact solar cell module according to claim 1, wherein the first part comprises pairs of a first deformation starting point and a second deformation starting point, and each deformation cushioning component is located between a corresponding pair of the first deformation starting point and the second deformation starting point; and
   in the direction where the second fine grid lines are provided, distances between second fine grid lines that are located between the first deformation starting point and the second deformation starting point and the projection of the deformation cushioning component are greater than distances between the other second fine grid lines and the projection of the deformation cushioning component by at least 0.3 mm.

3. The back contact solar cell module according to claim 1, wherein the first part comprises pairs of a first deformation starting point and a second deformation starting point, and each deformation cushioning component is located between a corresponding pair of the first deformation starting point and the second deformation starting point; and
one end close to the deformation cushioning component of second fine grid lines that are located between the first deformation starting point and the second deformation starting point is provided with a bending section, and in the direction where the second fine grid lines are provided, a minimum distance between the bending section and the projection of the deformation cushioning component is greater than or equal to 0.3 mm.

4. The back contact solar cell module according to claim 3, wherein the bending section is parallel to a part of the deformation cushioning component that corresponds to the bending section.

5. The back contact solar cell module according to claim 1, wherein a bending direction of deformation cushioning components of the second part is opposite to a bending direction of the deformation cushioning components of the first part.

6. The back contact solar cell module according to claim 1, wherein
all of regions between each two bonding pads in the first part are provided with at least one deformation cushioning component.

7. The back contact solar cell module according to claim 1, wherein the deformation cushioning components are a circular-arc-shaped bend, and a radius of the circular-arc-shaped bend is less than or equal to 0.2 mm.

8. The back contact solar cell module according to claim 7, wherein the circular-arc-shaped bend is parallel to or perpendicular to a shadow face of the back contact solar cell.

9. The back contact solar cell module according to claim 1, wherein the deformation cushioning components are a V-shaped bend.

10. The back contact solar cell module according to claim 9, wherein the V-shaped bend is parallel to or perpendicular to a shadow face of the back contact solar cell.

11. The back contact solar cell module according to claim 1, wherein a size of the electrically conducting line at the deformation cushioning components is the same as a size of the remaining electrically conducting line.

12. The back contact solar cell module according to claim 1, wherein each of the electrically conducting lines comprises a circular tinned-copper solder strip, and a diameter of the circular tinned-copper solder strip is greater than or equal to 0.25 mm and less than or equal to 0.5 mm.

13. The back contact solar cell module according to claim 1, wherein each of the electrically conducting lines is a circular solder strip or a flat solder strip.

* * * * *